(12) United States Patent
Chen et al.

(10) Patent No.: US 12,354,885 B2
(45) Date of Patent: Jul. 8, 2025

(54) ELECTRONIC PACKAGE, ELECTRONIC STRUCTURE AND MANUFACTURING METHOD THEREOF

(71) Applicant: SILICONWARE PRECISION INDUSTRIES CO., LTD., Taichung (TW)

(72) Inventors: Yi-Ling Chen, Taichung (TW); Kuan-Wei Chuang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 198 days.

(21) Appl. No.: 18/310,428

(22) Filed: May 1, 2023

(65) Prior Publication Data

US 2024/0258121 A1 Aug. 1, 2024

(30) Foreign Application Priority Data

Jan. 30, 2023 (TW) ................. 112103067

(51) Int. Cl.
| | |
|---|---|
| H05K 3/46 | (2006.01) |
| H01L 21/48 | (2006.01) |
| H01L 23/498 | (2006.01) |
| H01L 25/065 | (2023.01) |
| H01L 25/16 | (2023.01) |
| H05K 1/11 | (2006.01) |
| H05K 1/18 | (2006.01) |

(52) U.S. Cl.
CPC ........ *H01L 21/486* (2013.01); *H01L 21/4853* (2013.01); *H01L 23/49827* (2013.01); *H01L 25/0655* (2013.01); *H01L 25/16* (2013.01); *H05K 1/115* (2013.01); *H05K 1/119* (2013.01); *H05K 1/181* (2013.01); *H05K 3/4602* (2013.01); *H05K 3/4688* (2013.01)

(58) Field of Classification Search
CPC ...... H05K 1/115; H05K 1/119; H05K 3/4602; H05K 3/4688
See application file for complete search history.

(56) References Cited

U.S. PATENT DOCUMENTS

| | | | | |
|---|---|---|---|---|
| 2016/0020145 | A1* | 1/2016 | Lee | H01L 21/76834 |
| | | | | 438/618 |
| 2018/0204828 | A1* | 7/2018 | Lu | H01L 25/50 |
| 2020/0058606 | A1* | 2/2020 | Tsai | H01L 23/481 |
| 2022/0093543 | A1* | 3/2022 | Seo | H01L 24/81 |

* cited by examiner

*Primary Examiner* — Sherman Ng
(74) *Attorney, Agent, or Firm* — Studebaker Brackett PLLC

(57) ABSTRACT

An electronic structure is provided, in which a plurality of conductors are disposed on one surface of an electronic body, an epoxy molding compound is used as a protective layer to encapsulate the plurality of conductors, a circuit portion is bonded onto the other surface of the electronic body, and a plurality of external bumps and solder material are formed on the circuit portion. Therefore, with the design of the protective layer, heat energy can be effectively transferred from the protective layer to the solder material below during a process of heating the electronic structure so as to avoid a problem of non-wetting of the solder material.

15 Claims, 7 Drawing Sheets

ELECTRONIC PACKAGE, ELECTRONIC STRUCTURE AND MANUFACTURING METHOD THEREOF

BACKGROUND

1. Technical Field

The present disclosure relates to a semiconductor device, and more particularly, to an electronic package and electronic structure and manufacturing method thereof.

2. Description of Related Art

In order to ensure the miniaturization and multi-functionality of electronic products and communication equipment, semiconductor packaging needs to be developed towards miniaturization to facilitate multi-pin connection and high functionality. For example, in advanced process packaging, commonly used packaging processes such as 2.5D packaging process, fan-out wiring combined with the process of embedded bridge elements (referred to as FO-EB), wherein the FO-EB has the advantages of low cost and more material suppliers relative to the 2.5D packaging process.

FIG. 1A to FIG. 1B are schematic cross-sectional views illustrating part of the manufacturing process of a conventional semiconductor package.

As shown in FIG. 1A, an electronic structure 1a and a carrier 9 with an insulating layer 14 disposed on the carrier 9 are provided, and a plurality of conductive pillars 13 are formed on the carrier 9.

The carrier 9 is, for example, a plate made of semiconductor material (such as silicon or glass), on which a release layer 90 and a metal layer 91 made of such as titanium/copper are sequentially formed by, for example, coating, so that the insulating layer 14 is formed on the metal layer 91, and a circuit layer 141 is formed in and bonded to the insulating layer 14, wherein the material forming the insulating layer 14 is a dielectric material.

The electronic structure 1a comprises an electronic body 11, a circuit portion 12, a plurality of conductors 11a formed on the electronic body 11, and a plurality of copper bumps 12a formed on the circuit portion 12 and electrically connected to the circuit portion 12, wherein a solder material 12c is formed on each of the copper bumps 12a. Next, a dielectric layer 11b made of polyimide (PI) is formed on the electronic body 11, so that the plurality of conductors 11a are covered by the dielectric layer 11b, and a bonding layer 12b is formed on the circuit portion 12, so that the plurality of copper bumps 12a and the solder material 12c are covered by the bonding layer 12b.

The electronic body 11 is a silicon substrate and has a plurality of conductive through vias 110 penetrating through the electronic body 11 to electrically connect the circuit portion 12 and the plurality of conductors 11a.

The circuit portion 12 comprises at least one passivation layer 120 and conductive traces 121 bonded to the passivation layer 120, so that the conductive traces 121 are electrically connected to the conductive through vias 110 and the plurality of copper bumps 12a.

As shown in FIG. 1B, the electronic structure 1a is bonded onto the insulating layer 14 by the bonding layer 12b on the electronic structure 1a, so that the solder material 12c is bonded to the circuit layer 141, and then the subsequent packaging process is performed.

However, in the conventional semiconductor package, when the subsequent packaging process is performed, since the electronic body 11 is covered with the dielectric layer 11b made of PI material and the thermal conductivity of the PI material is relatively low (that is, less than 1 W/mK), heat energy will accumulate in the dielectric layer 11b made of the PI material during the heating process and cannot be effectively transmitted to the solder material 12c below, resulting in non-wetting of the solder material 12c.

Furthermore, since the dielectric layer 11b made of the PI material still in a semi-soluble fluid state of the B stage during the cooling process, the dielectric layer 11b still has a certain viscosity, and such that a suction jig 70 of a removing device body 7 used for removing the electronic structure 1a is easily stuck with the PI material during the process of separating the electronic structure 1a, which causes the suction jig 70 (as indicated by the dotted line in FIG. 1B) to adhere onto the electronic structure 1a and detach from the removing device body 7.

Therefore, there is a need for a solution that addresses the aforementioned shortcomings of the prior art.

SUMMARY

In view of the aforementioned shortcomings of the prior art, the present disclosure provides an electronic structure, which comprises: an electronic body; a plurality of conductors disposed on one surface of the electronic body; a protective layer formed on the electronic body and covering the plurality of conductors, wherein the protective layer is made of an epoxy molding compound; a circuit portion bonded onto the other surface of the electronic body; a plurality of external bumps formed on and electrically connected to the circuit portion; a solder material formed on each of the plurality of external bumps; and a bonding layer formed on the circuit portion and covering the plurality of external bumps and the solder material.

The present disclosure further provides a method of manufacturing an electronic structure, the method comprises: providing an electronic body with a plurality of conductors disposed on one surface of the electronic body and a circuit portion bonded onto the other surface of the electronic body; forming a plurality of external bumps on the circuit portion, wherein the plurality of external bumps are electrically connected to the circuit portion, and a solder material is formed on each of the plurality of external bumps; forming a bonding layer on the circuit portion to cover the plurality of external bumps and the solder material; forming an epoxy molding compound on the electronic body to cover the plurality of conductors; thermosetting the epoxy molding compound; and polishing the epoxy molding compound to form a protective layer.

In the aforementioned electronic structure and method, a total height being a sum of a height of each of the plurality of external bumps and a height of the solder material is less than or equal to a thickness of the bonding layer.

In the aforementioned electronic structure and method, a thickness of the protective layer is greater than a thickness of the bonding layer.

In the aforementioned electronic structure and method, a thickness of the protective layer is five times a thickness of the bonding layer.

In the aforementioned electronic structure and method, a thickness of the protective layer is 5 microns to 30 microns.

In the aforementioned electronic structure and method, a thickness of the bonding layer is 15 microns to 50 microns.

In the aforementioned electronic structure and method, the electronic body is a silicon substrate and has a plurality of conductive through vias penetrating through the electronic body and electrically connected to the circuit portion and the plurality of conductors.

The present disclosure further provides an electronic package, which comprises: an encapsulation layer; the aforementioned electronic structure embedded in the encapsulation layer; and a plurality of conductive pillars embedded in the encapsulation layer.

In the aforementioned electronic package, the present disclosure further comprises a circuit structure formed on the encapsulation layer and electrically connected to the plurality of conductive pillars and the plurality of conductors. Further, the electronic package may comprise at least one electronic element disposed on and electrically connected to the circuit structure.

As can be understood from the above, in the electronic package of the present disclosure and the electronic structure and manufacturing method thereof, the epoxy molding compound with high thermal conductivity is used as the protective layer which replaces the dielectric layer made of the conventional PI material. Therefore, compared with the prior art, the heat energy can be effectively transferred to the external bumps below to melt the solder material in the process of heating the electronic structure, thereby preventing the solder material from non-wetting.

Furthermore, in the cooling process, the epoxy molding compound is set in shape after thermosetting (i.e., becoming a solid), so the protective layer is no longer viscous. Therefore, compared with the prior art, the suction jig of the removing device body used for removing the electronic structure will not be stuck with the encapsulant (e.g., the epoxy molding compound) during the process of separating the electronic structure, so as to prevent the suction jig from adhering to the electronic structure and detaching from the removing device body.

BRIEF DESCRIPTION OF THE DRAWINGS

FIG. 2A-2 is a schematic cross-sectional view showing one step of the manufacturing process of FIG. 2A-1.

DETAILED DESCRIPTION

Figure 1A:
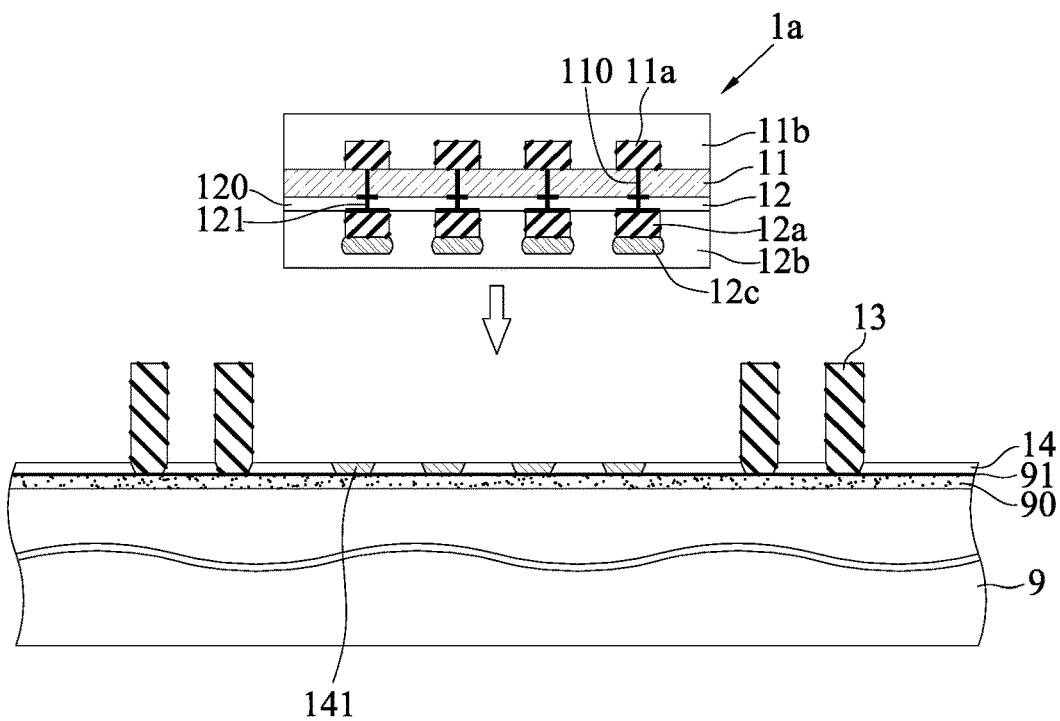
FIG. 1A to FIG. 1B are schematic cross-sectional views illustrating part of a manufacturing process of a conventional semiconductor package.
Figure 1B:
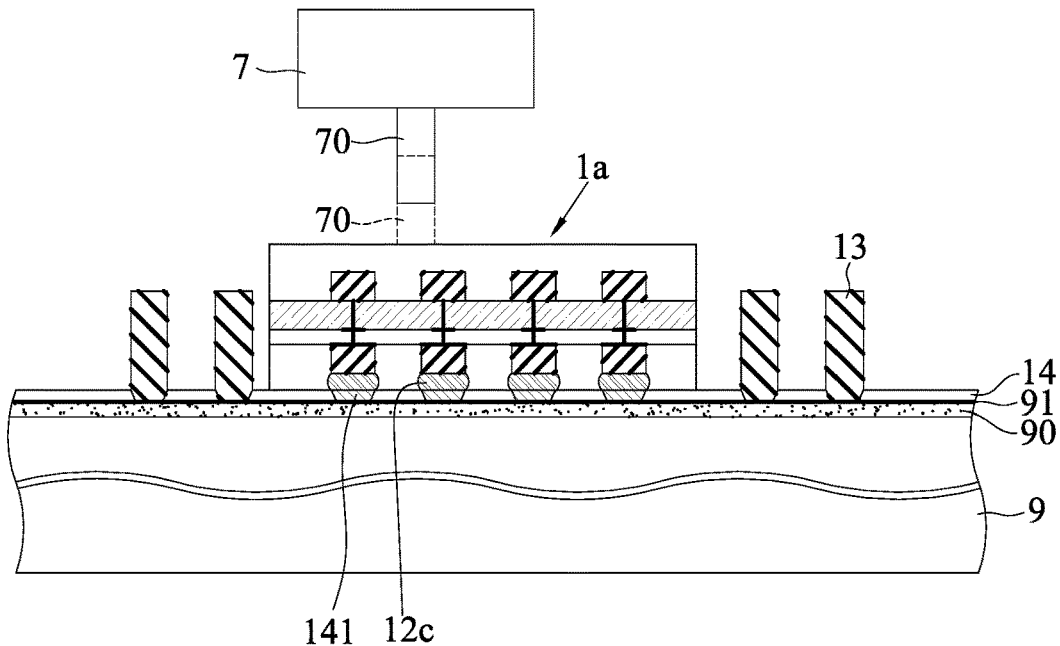

Implementations of the present disclosure are described below by embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios, or sizes are construed as falling within the scope covered by the technical contents disclosed herein. Meanwhile, terms such as "on," "above," "first," "second," "a," "one" and the like, are for illustrative purposes, and are not meant to limit the scope implementable by the present disclosure. Any changes or adjustments made to the relative relationships, without substantially modifying the technical contents, are also to be construed as within the scope implementable by the present disclosure.

Figures 1, 2A:
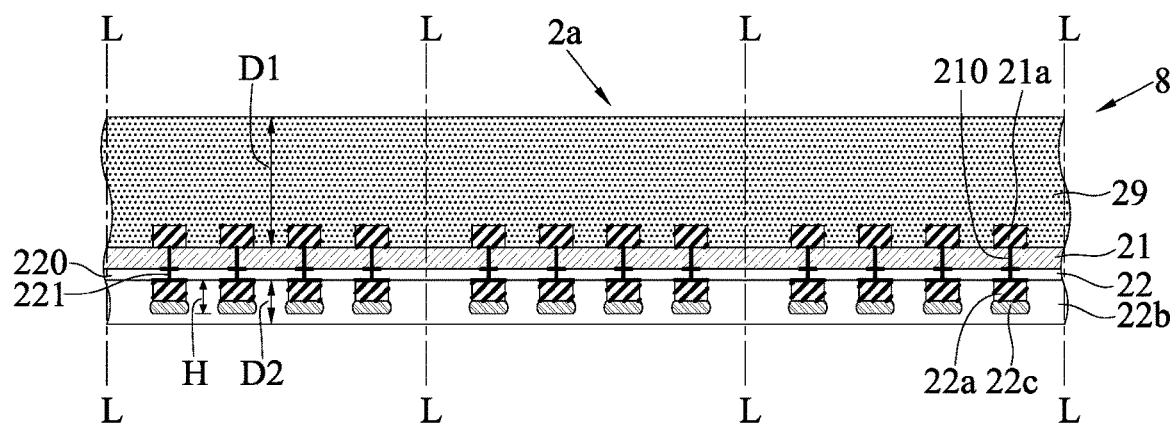
FIG. 2A-1, FIG. 2B, FIG. 2C, FIG. 2D, FIG. 2E, FIG. 2F, FIG. 2G and FIG. 2H are schematic cross-sectional views illustrating a manufacturing method of an electronic package of the present disclosure.
Figures 2, 2A:
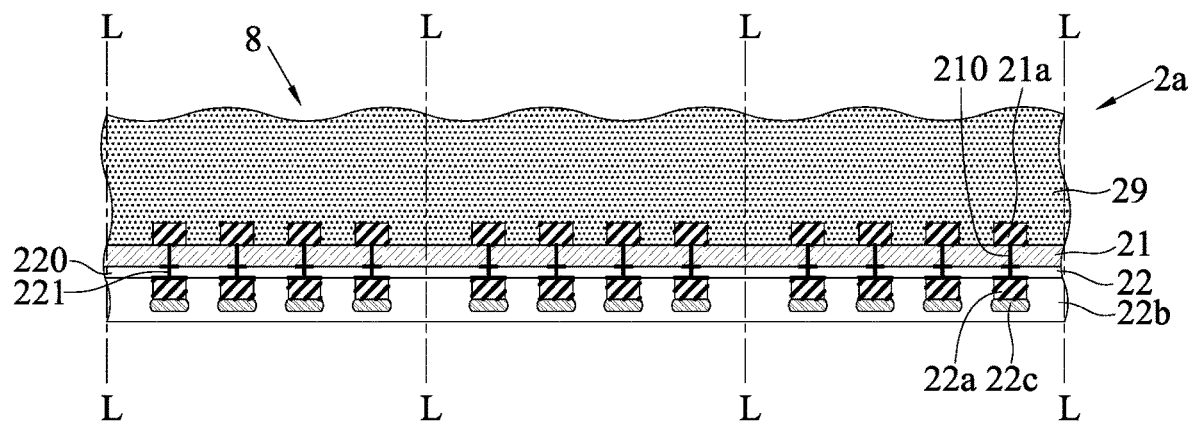
Figure 2B:
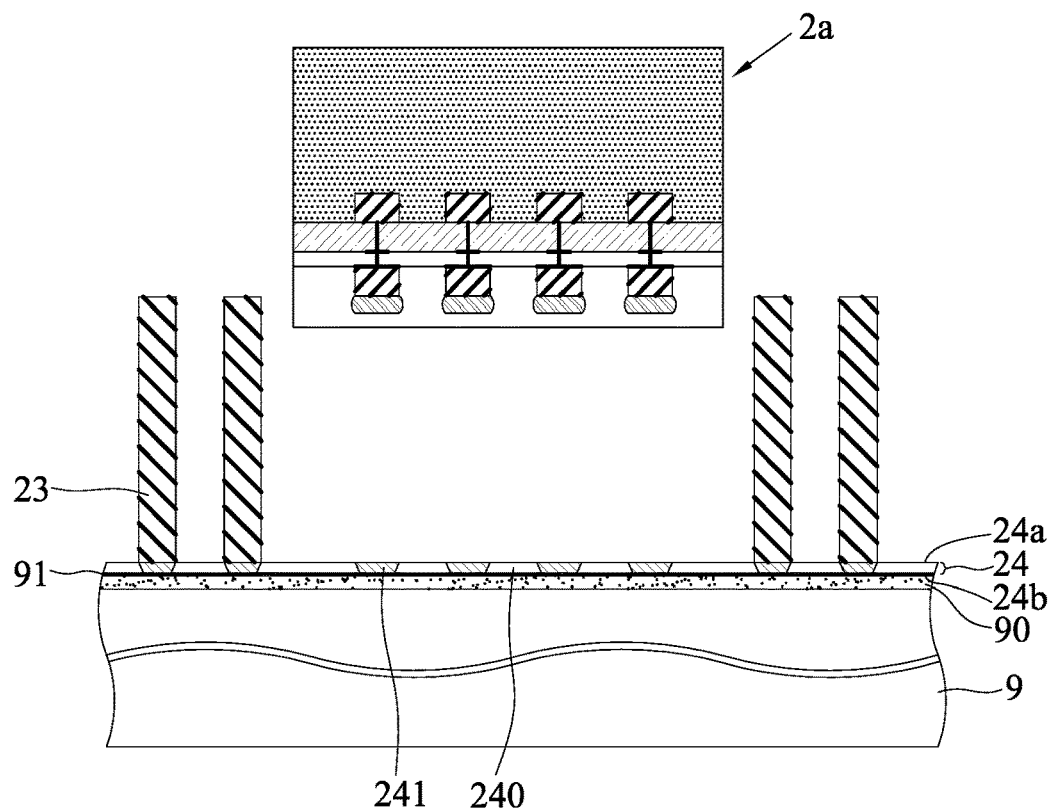
Figure 2C:
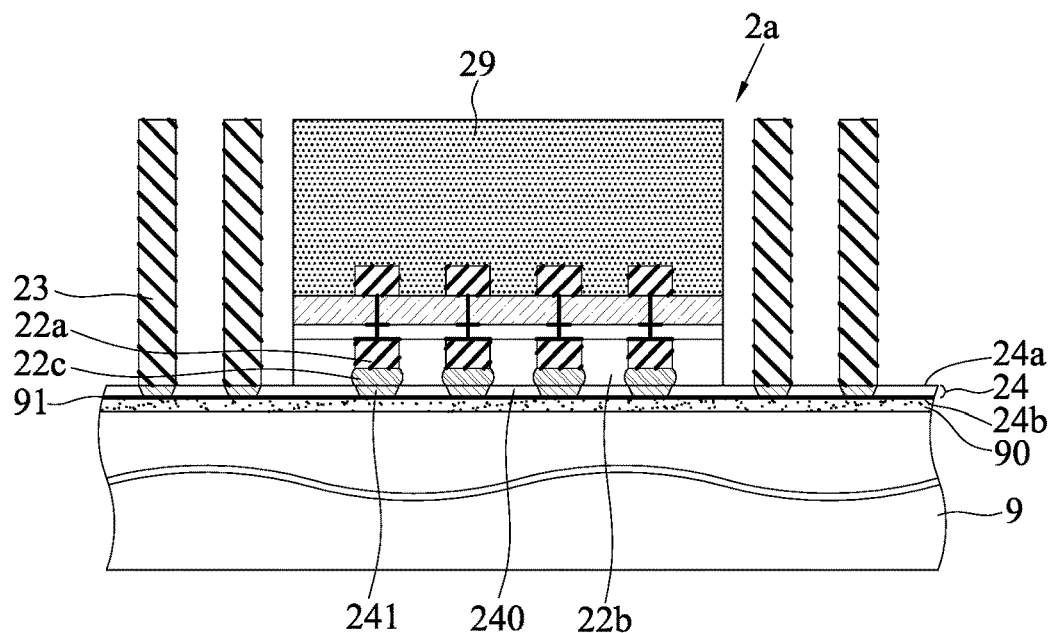
Figure 2D:
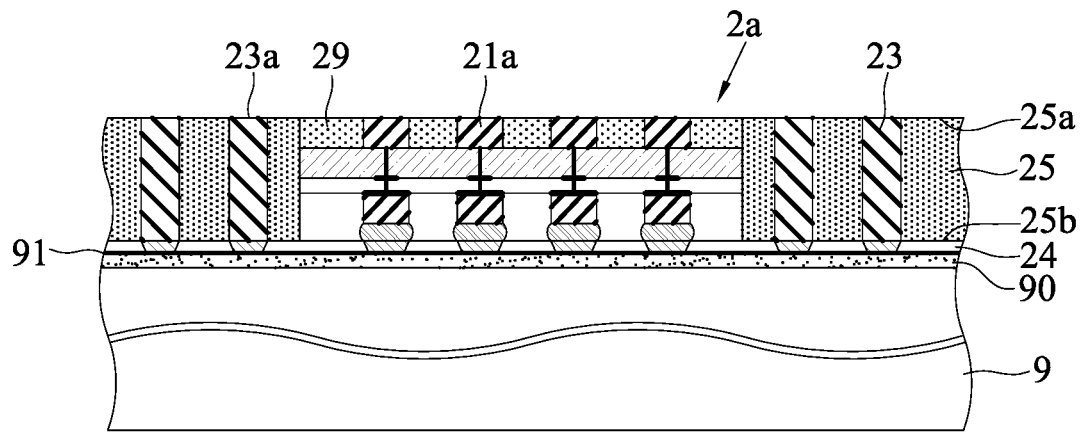
Figure 2E:
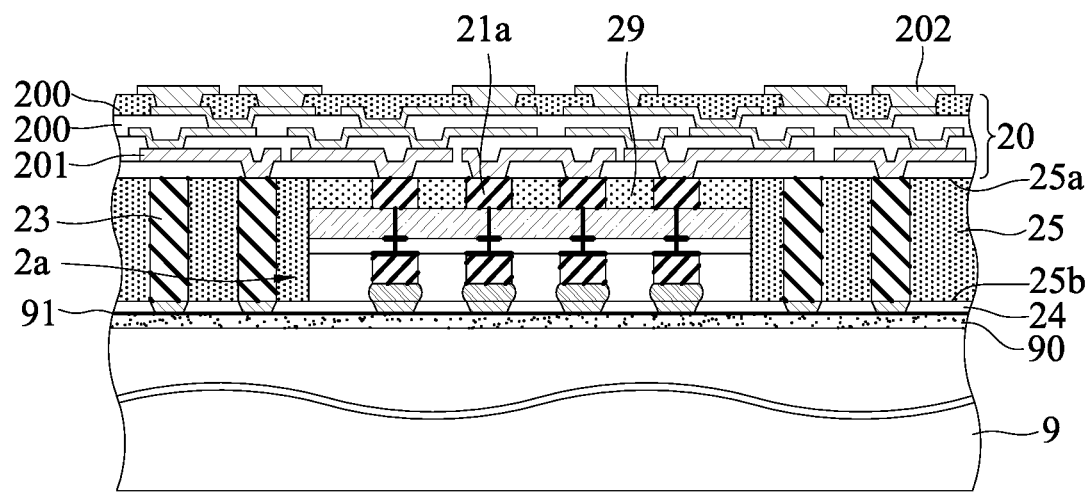
Figure 2F:
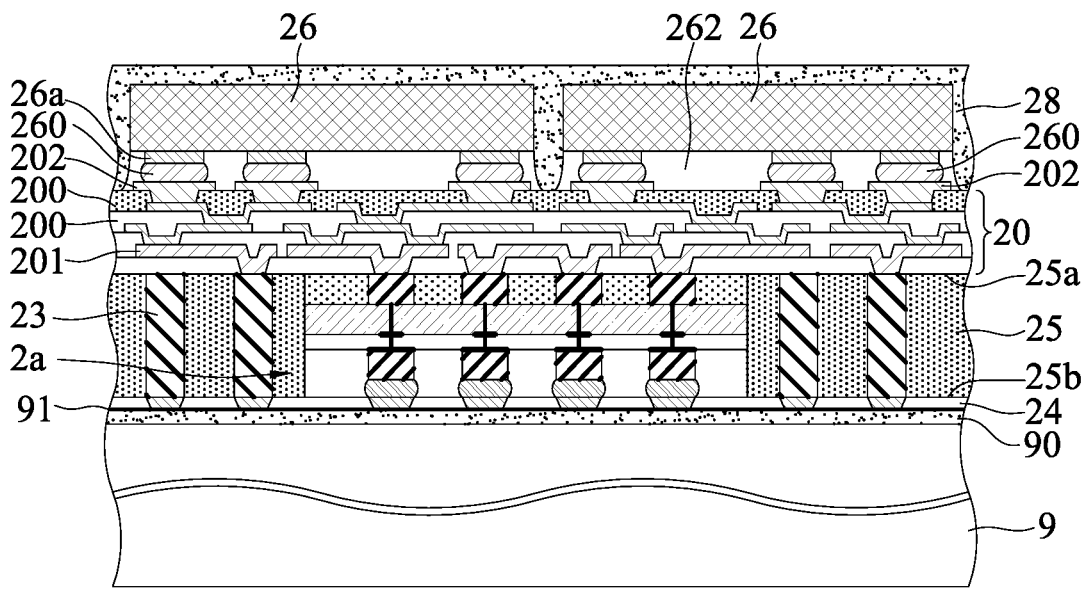
Figure 2G:
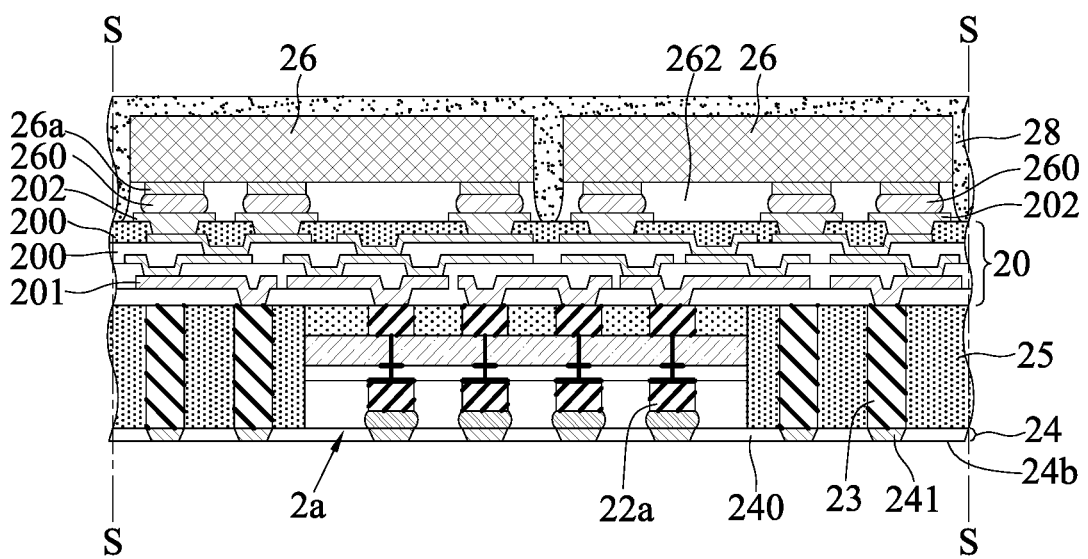
Figure 2H:
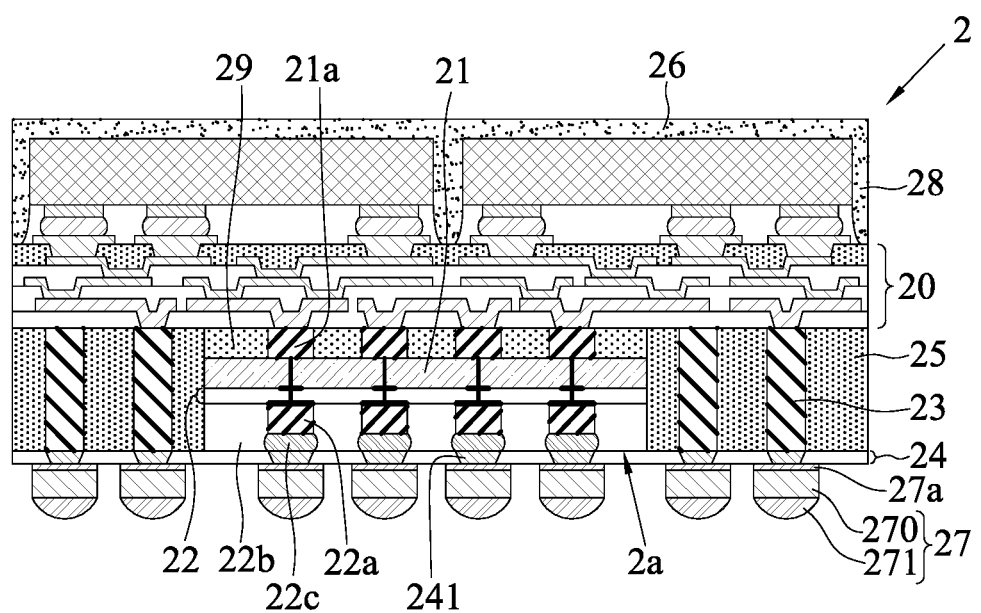

FIG. 2A-1 to FIG. 2H are schematic cross-sectional views illustrating a manufacturing method of an electronic package 2 of the present disclosure.

As shown in FIG. 2A-1, an electronic board body 8 is provided and comprises a plurality of electronic structures 2a arranged in an array.

Each of the electronic structures 2a comprises an electronic body 21, a circuit portion 22 bonded to the electronic body 21, a plurality of conductors 21a formed on the electronic body 21, and a plurality of external bumps 22a formed on the circuit portion 22 and electrically connected to the circuit portion 22, wherein a solder material 22c is formed on each of the external bumps 22a, and a bonding layer 22b is formed on the circuit portion 22 to cover the external bumps 22a and the solder material 22c, and a protective layer 29 is formed on one surface of each of the electronic structures 2a to cover the conductors 21a.

In an embodiment, the electronic body 21 is a silicon substrate such as a semiconductor chip and has a plurality of conductive through vias 210 such as conductive through-silicon vias (TSVs) penetrating through the electronic body 21 to electrically connect the circuit portion 22 and the plurality of conductors 21a. For example, the circuit portion 22 is bonded onto the other surface of the electronic body 21 and comprises at least one passivation layer 220 bonded to the electronic body 21 and at least one conductive trace 221 bonded to the passivation layer 220, so that the conductive traces 221 are electrically connected to the conductive through vias 210 and the plurality of external bumps 22a. It should be understood that the structure of the device having the conductive through vias 210 can be various, but not limit to the above.

Furthermore, the conductors 21a and the external bumps 22a are metal pillars such as copper pillars, and the bonding layer 22b is a non-conductive film (NCF). For example, the external bumps 22a and the solder material 22c are fabricated first on the circuit portion 22 of each of the electronic structures 2a, and the non-conductive film (the bonding layer 22b) is then pasted. Therefore, when the configuration specifications such as small pitch, low height and high density are applied to the external bumps 22a, it is beneficial to cover the external bumps 22a by selecting a non-conductive film as the bonding layer 22b.

Also, a total height H being a sum of a height of each of the external bumps 22a and a height of the solder material 22c is less than or equal to a thickness D2 of the bonding layer 22b, so that the external bumps 22a and the solder material 22c are completely covered by the bonding layer 22b.

The protective layer 29 is made of epoxy molding compound (EMC). For example, the protective layer 29 can be formed on the electronic board body 8 in a manner of liquid compound, injection, lamination, or compression molding.

In an embodiment, a thickness D1 of the protective layer 29 is greater than the thickness D2 of the bonding layer 22b. For example, the thickness D1 of the protective layer 29 is five times the thickness D2 of the bonding layer 22b, wherein the thickness D1 of the protective layer 29 is 5-30 microns (μm), preferably 15-25 μm, and the thickness D2 of the bonding layer 22b is 15-50 μm, preferably 20-40 μm.

In addition, as shown in FIG. 2A-2, in the manufacturing process of the protective layer 29, the epoxy molding compound is formed on the electronic body 21 first, so that the plurality of conductors 21a are covered by the epoxy molding compound, and then the epoxy molding compound is baked to thermoset the epoxy molding compound. After that, the epoxy molding compound is ground and polished to form the protective layer 29.

As shown in FIG. 2B, a carrier 9 formed with a plurality of conductive pillars 23 is provided, and the electronic board body 8 is cut along cutting paths L shown in FIG. 2A-1 to obtain the plurality of electronic structures 2a.

In an embodiment, the carrier 9 is, for example, a plate made of semiconductor material (such as silicon or glass), on which a release layer 90 and a metal layer 91 made of such as titanium/copper are sequentially formed by, for example, coating, so that a routing structure 24 (e.g., a wiring structure) is formed on the metal layer 91.

The routing structure 24 has a first side 24a and a second side 24b opposing the first side 24a, and the routing structure 24 is bonded to the metal layer 91 by the second side 24b of the routing structure 24.

Furthermore, the routing structure 24 comprises at least one dielectric layer 240 and a circuit layer 241 bonded to the dielectric layer 240. For example, the material forming the dielectric layer 240 is such as polybenzoxazole (PBO), polyimide (PI), prepreg (PP), or other dielectric materials, and the circuit layer 241 and the dielectric layer 240 can be formed by a redistribution layer (RDL) process.

Also, the conductive pillars 23 are disposed on the first side 24a of the routing structure 24 and electrically connected to the circuit layer 241. In an embodiment, the material forming the conductive pillars 23 is metal material such as copper or solder material. For example, the conductive pillars 23 are formed in a manner of electroplating on the circuit layer 241 by exposure and development.

As shown in FIG. 2C, the electronic structure 2a is disposed on the carrier 9, such that the electronic structure 2a is surrounded by the conductive pillars 23.

In an embodiment, the electronic structure 2a is bonded onto the first side 24a of the routing structure 24 by the bonding layer 22b of the electronic structure 2a, so that the external bumps 22a are bonded to the circuit layer 241 by the solder material 22c.

Since the electronic body 21 is covered with the protective layer 29 made of epoxy molding compound, and the thermal conductivity of the epoxy molding compound is relatively high (i.e., greater than 1 W/mK), so compared with the prior art, the heat energy can be effectively transferred to the external bumps 22a below to melt the solder material 22c during the process of heating the electronic structure 2a, and thus preventing the solder material 22c from non-wetting.

Furthermore, in the cooling process, the epoxy molding compound is set in shape after thermosetting (i.e., becoming a solid), so the protective layer 29 is no longer viscous. Therefore, compared with the prior art, a suction jig of a removing device body used for removing the electronic structure 2a will not be stuck with the encapsulant (e.g., the epoxy molding compound) during the process of separating the electronic structure 2a, so as to prevent the suction jig from adhering to the electronic structure 2a and detaching from the removing device body.

As shown in FIG. 2D, an encapsulation layer 25 is formed on the first side 24a of the routing structure 24, so that the electronic structure 2a, the protective layer 29 and the conductive pillars 23 are covered by the encapsulation layer 25, wherein the encapsulation layer 25 has a first surface 25a and a second surface 25b opposing the first surface 25a, wherein a top surface of the protective layer 29, end surfaces of the conductors 21a and surfaces of end portions 23a of the conductive pillars 23 are exposed from the first surface 25a of the encapsulation layer 25, and the encapsulation layer 25 is bonded onto the first side 24a of the routing structure 24 with the second surface 25b of the encapsulation layer 25.

In an embodiment, the encapsulation layer 25 is made of an insulating material, such as polyimide (PI), dry film, molding colloid or molding compound such as epoxy resin. For example, the encapsulation layer 25 can be formed on the routing structure 24 in a manner of liquid compound, injection, lamination, or compression molding. It should be understood that the material forming the protective layer 29 may be the same as or different from the material forming the encapsulation layer 25.

Furthermore, the first surface 25a of the encapsulation layer 25 can be flush with the top surface of the protective layer 29, the surfaces of the end portions 23a of the conductive pillars 23 and the end surfaces of the conductors 21a by a polishing process, such that the surfaces of the end portions 23a of the conductive pillars 23 and the end surfaces of the conductors 21a are exposed from the first surface 25a of the encapsulation layer 25. For example, the polishing process removes part of the material of the protective layer 29, part of the material of the conductive pillars 23, part of the material of the conductors 21a and part of the material of the encapsulation layer 25 by grinding.

As shown in FIG. 2E, a circuit structure 20 is formed on the first surface 25a of the encapsulation layer 25 and the protective layer 29, so that the circuit structure 20 is electrically connected to the conductive pillars 23 and the conductors 21a.

In an embodiment, the circuit structure 20 comprises at least one insulating layer 200 and at least one redistribution layer (RDL) 201 disposed on the insulating layer 200. The embodiment shows a plurality of the insulating layers 200 and a plurality of the redistribution layers. 201, wherein the outermost insulating layer 200 can be used as a solder-resist layer, and the outermost redistribution layer 201 is exposed from the solder-resist layer so as to serve as electrical contact pads 202 such as micro pads (commonly known as μ-pads).

Furthermore, the material forming the redistribution layer 201 is copper, and the material forming the insulating layer 200 is such as polybenzoxazole (PBO), polyimide (PI), prepreg (PP), or other dielectric materials, or solder-resist materials such as green paint and ink.

As shown in FIG. 2F, a plurality of electronic elements 26 are disposed on the circuit structure 20, and then the electronic elements 26 are covered by a packaging layer 28.

In an embodiment, each of the electronic elements 26 is an active element, a passive element, or a combination of the active element and the passive element, wherein the active element may be a semiconductor chip, and the passive element may be a resistor, a capacitor, or an inductor. In one embodiment, each of the electronic elements 26 is a semiconductor chip such as a graphics processing unit (GPU), a high bandwidth memory (HBM), etc., and the electronic structure 2a is electrically connected to the circuit structure 20 by the conductors 21a and is further electrically connected to the electronic elements 26.

Moreover, each of the electronic elements 26 has a plurality of conductive bumps 26a such as copper pillars and is electrically connected to the electrical contact pads 202 via a plurality of solder material 260 such as solder bumps, and the electronic elements 26 and the conductive bumps 26a are covered by the packaging layer 28 simultaneously. In other embodiments, an under bump metallurgy (UBM) layer (not shown) may be formed on the electrical contact pads 202 or the electronic elements 26 to facilitate bonding the solder material 260 or the conductive bumps 26a.

Also, the packaging layer 28 is made of an insulating material such as polyimide (PI), dry film, molding colloid or molding compound such as epoxy resin, and the packaging layer 28 can be formed on the circuit structure 20 in a manner of lamination or molding. It should be understood that the material forming the packaging layer 28 may be the same as or different from the material forming the encapsulation layer 25.

In addition, an underfill 262 can also be formed between the electronic elements 26 and the circuit structure 20 to cover the conductive bumps 26a and the solder material 260, and then the packaging layer 28 is formed to cover the underfill 262 and the electronic elements 26.

As shown in FIG. 2G, the carrier 9 and the release layer 90 on the carrier 9 are removed, and then the metal layer 91 is removed to expose the second side 24b of the routing structure 24.

In an embodiment, when peeling off the release layer 90, the metal layer 91 is used as a barrier to avoid damaging the dielectric layer 240 of the routing structure 24, and the metal layer 91 is then removed by etching after removing the carrier 9 and the release layer 90 on the carrier 9 so as to expose the circuit layer 241.

As shown in FIG. 2H, a singulation process is proceeded along cutting paths S shown in FIG. 2G, and a plurality of conductive elements 27 are formed on the second side 24b of the routing structure 24, so that the conductive elements 27 are electrically connected to the circuit layer 241, thereby obtaining the electronic package 2.

In an embodiment, each of the conductive elements 27 comprises a metal bump 270 made of such as copper and a solder material 271 formed on the metal bump 270. For example, an under bump metallization (UBM) layer 27a may be formed on the circuit layer 241 to facilitate bonding to the metal bumps 270. It should be understood that when the number of contacts (IOs) is insufficient, the build-up operation can still be performed by the RDL process to reconfigure the number and positions of the IOs of the routing structure 24.

Figure 3:
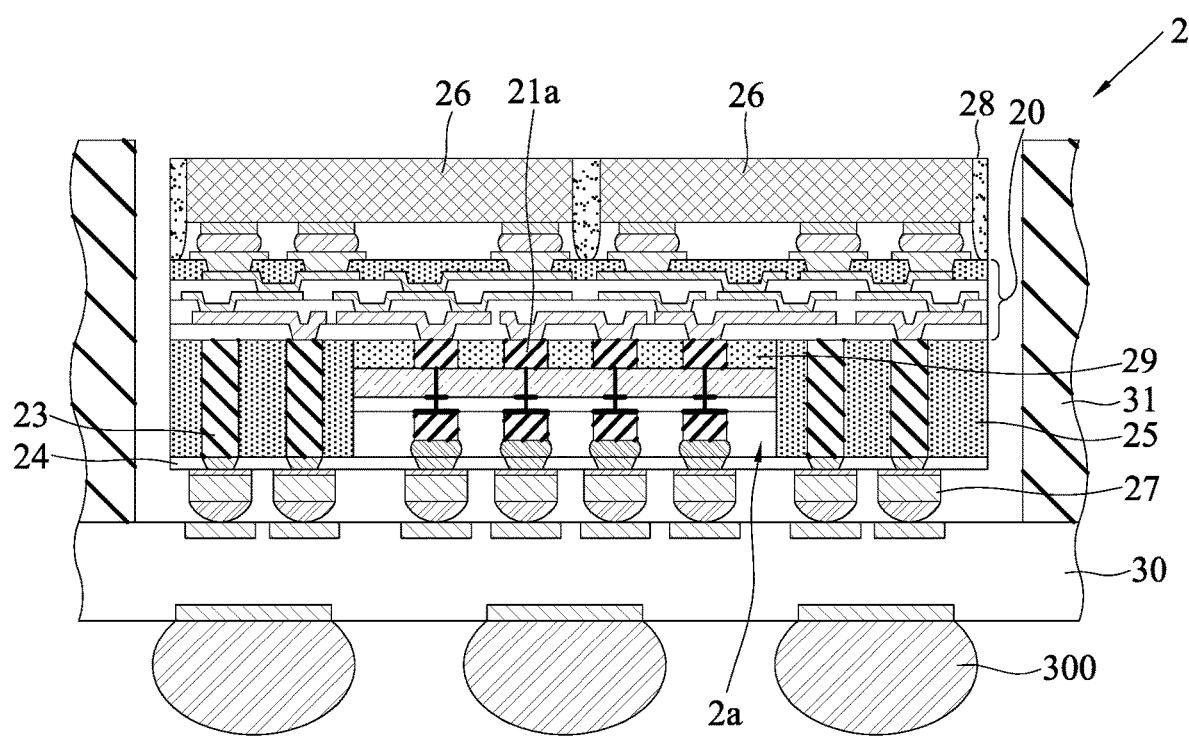
FIG. 3 is a schematic cross-sectional view showing the subsequent manufacturing process of FIG. 2H.

Furthermore, as shown in FIG. 3, part of the material of the packaging layer 28 can be removed by a polishing process such as grinding, so that the upper surface of the packaging layer 28 is flush with the upper surfaces of the electronic elements 26, so that the electronic elements 26 are exposed from the packaging layer 28.

Also, as shown in FIG. 3, the electronic package 2 can be disposed on a package substrate 30 via the conductive elements 27. Further, a ball-placement process is performed on a lower side of the package substrate 30 to form a plurality of conductive elements 300 such as solder balls, so that the package substrate 30 can be disposed on a circuit board (not shown) with the conductive elements 300 on the lower side of the package substrate 30 in a subsequent process.

In addition, a stiffener 31 (such as a metal frame shown in FIG. 3) can be disposed on the package substrate 30 according to requirements so as to eliminate the problem of stress concentration and prevent the electronic package 2 from warping.

The present disclosure also provides an electronic structure 2a, which comprises: an electronic body 21, a protective layer 29, a circuit portion 22, a plurality of external bumps 22a, and a bonding layer 22b.

A plurality of conductors 21a are formed on one surface of the electronic body 21.

The protective layer 29 is formed on the electronic body 21 to cover the plurality of conductors 21a, wherein the protective layer 29 is made of an epoxy molding compound.

The circuit portion 22 is bonded onto the other surface of the electronic body 21.

The external bumps 22a are formed on the circuit portion 22 and electrically connected to the circuit portion 22, wherein a solder material 22c is formed on each of the external bumps 22a.

The bonding layer 22b is formed on the circuit portion 22 to cover the plurality of external bumps 22a and the solder material 22c.

In one embodiment, a total height H being a sum of a height of each of the external bumps 22a and a height of the solder material 22c is less than or equal to a thickness D2 of the bonding layer 22b.

In one embodiment, a thickness D1 of the protective layer 29 is greater than the thickness D2 of the bonding layer 22b.

In one embodiment, the thickness D1 of the protective layer 29 is five times the thickness D2 of the bonding layer 22b.

In one embodiment, the thickness D1 of the protective layer 29 is 5 microns to 30 microns.

In one embodiment, the thickness D2 of the bonding layer 22b is 15 microns to 50 microns.

In one embodiment, the electronic body 21 is a silicon substrate and has a plurality of conductive through vias 210 penetrating through the electronic body 21 to electrically connect the circuit portion 22 and the plurality of conductors 21a.

In addition, the present disclosure further provides an electronic package 2, which comprises: an encapsulation layer 25, the electronic structure 2a and a plurality of conductive pillars 23 embedded in the encapsulation layer 25.

In one embodiment, the electronic package 2 further comprises a circuit structure 20 formed on the encapsulation layer 25 and electrically connected to the plurality of conductive pillars 23 and the plurality of conductors 21a. Further, the electronic package 2 further comprises at least one electronic element 26 disposed on the circuit structure 20 and electrically connected to the circuit structure 20.

In view of the above, the electronic package of the present disclosure and the electronic structure and manufacturing method thereof use epoxy molding compound as a protective layer which replaces the dielectric layer made of the conventional PI material. Therefore, the heat energy can be effectively transferred to the external bumps below to melt the solder material in the process of heating the electronic structure, thereby preventing the solder material from non-wetting.

Furthermore, in the cooling process, the epoxy molding compound is set in shape after thermosetting (i.e., becoming a solid), so the protective layer is no longer viscous. Therefore, the suction jig of the removing device body used for removing the electronic structure will not be stuck with the encapsulant (e.g., the epoxy molding compound) during the process of separating the electronic structure, so as to prevent the suction jig from adhering to the electronic structure and detaching from the removing device body.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic structure, comprising:
   an electronic body;
   a plurality of conductors disposed on one surface of the electronic body;
   a protective layer formed on the electronic body and covering the plurality of conductors, wherein the protective layer is made of an epoxy molding compound;
   a circuit portion bonded onto the other surface of the electronic body;
   a plurality of external bumps formed on and electrically connected to the circuit portion;
   a solder material formed on each of the plurality of external bumps; and
   a bonding layer formed on the circuit portion and covering the plurality of external bumps and the solder material, wherein a thickness of the protective layer is five times a thickness of the bonding layer.

2. The electronic structure of claim 1, wherein a total height being a sum of a height of each of the plurality of external bumps and a height of the solder material is less than or equal to a thickness of the bonding layer.

3. The electronic structure of claim 1, wherein a thickness of the protective layer is greater than a thickness of the bonding layer.

4. The electronic structure of claim 1, wherein a thickness of the protective layer is 5 microns to 30 microns.

5. The electronic structure of claim 1, wherein a thickness of the bonding layer is 15 microns to 50 microns.

6. The electronic structure of claim 1, wherein the electronic body is a silicon substrate and has a plurality of conductive through vias penetrating through the electronic body and electrically connected to the circuit portion and the plurality of conductors.

7. An electronic package, comprising:
   an encapsulation layer;
   the electronic structure of claim 1 embedded in the encapsulation layer; and
   a plurality of conductive pillars embedded in the encapsulation layer.

8. The electronic package of claim 7, further comprising a circuit structure formed on the encapsulation layer and electrically connected to the plurality of conductive pillars and the plurality of conductors.

9. The electronic package of claim 8, further comprising at least one electronic element disposed on and electrically connected to the circuit structure.

10. A method of manufacturing an electronic structure, comprising:
    providing an electronic body with a plurality of conductors disposed on one surface of the electronic body and a circuit portion bonded onto the other surface of the electronic body;
    forming a plurality of external bumps on the circuit portion, wherein the plurality of external bumps are electrically connected to the circuit portion, and a solder material is formed on each of the plurality of external bumps;
    forming a bonding layer on the circuit portion to cover the plurality of external bumps and the solder material;
    forming an epoxy molding compound on the electronic body to cover the plurality of conductors;
    thermosetting the epoxy molding compound; and
    polishing the epoxy molding compound to form a protective layer,
    wherein a thickness of the protective layer is five times a thickness of the bonding layer.

11. The method of claim 10, wherein a total height being a sum of a height of each of the plurality of external bumps and a height of the solder material is less than or equal to a thickness of the bonding layer.

12. The method of claim 10, wherein a thickness of the protective layer is greater than a thickness of the bonding layer.

13. The method of claim 10, wherein a thickness of the protective layer is 5 microns to 30 microns.

14. The method of claim 10, wherein a thickness of the bonding layer is 15 microns to 50 microns.

15. The method of claim 10, wherein the electronic body is a silicon substrate and has a plurality of conductive through vias penetrating through the electronic body and electrically connected to the circuit portion and the plurality of conductors.

* * * * *